(12) United States Patent
Sirviö et al.

(10) Patent No.: US 9,862,000 B2
(45) Date of Patent: Jan. 9, 2018

(54) ARRANGEMENT FOR PRODUCING AN ELECTRICALLY CONDUCTIVE PATTERN ON A SURFACE

(71) Applicant: STORA ENSO OYJ, Helsinki (FI)

(72) Inventors: Petri Sirviö, Imatra (FI); Juha Maijala, Espoo (FI)

(73) Assignee: STORA ENSO OYJ, Helsinki (FI)

( * ) Notice: Subject to any disclaimer, the term of this patent is extended or adjusted under 35 U.S.C. 154(b) by 0 days.

(21) Appl. No.: 15/146,006

(22) Filed: May 4, 2016

(65) Prior Publication Data

US 2016/0243577 A1 Aug. 25, 2016

Related U.S. Application Data

(62) Division of application No. 14/375,680, filed as application No. PCT/FI2013/050099 on Jan. 30, 2013, now Pat. No. 9,352,351.

(30) Foreign Application Priority Data

Jan. 30, 2012 (FI) ..................................... 20125087

(51) Int. Cl.
*H05K 3/10* (2006.01)
*B05B 5/14* (2006.01)
(Continued)

(52) U.S. Cl.
CPC ............ *B05C 1/003* (2013.01); *B05C 19/008* (2013.01); *B05D 1/007* (2013.01); *B05D 1/28* (2013.01);
(Continued)

(58) Field of Classification Search
None
See application file for complete search history.

(56) References Cited

U.S. PATENT DOCUMENTS 5,114,744 A * 5/1992 Cloutier ................ H05K 3/102
347/1
6,238,750 B1 5/2001 Correll et al.
(Continued)

FOREIGN PATENT DOCUMENTS

CN 101513139 A 8/2009
GB 895327 5/1962
(Continued)

OTHER PUBLICATIONS

International Search Report dated May 28, 2013, in PCT International Application No. PCT/FI2013/050099.
(Continued)

*Primary Examiner* — Binu Thomas
(74) *Attorney, Agent, or Firm* — Birch, Stewart, Kolasch & Birch, LLP

(57) ABSTRACT

A method and an arrangement are disclosed for producing an electrically conductive pattern on a surface. Electrically conductive solid particles are transferred onto an area of predetermined form on a surface of a substrate. The electrically conductive solid particles are heated to a temperature that is higher than a characteristic melting point of the electrically conductive solid particles, thus creating a melt. The melt is pressed against the substrate in a nip, wherein a surface temperature of a portion of the nip that comes against the melt is lower than said characteristic melting point.

5 Claims, 2 Drawing Sheets

Figure 1:
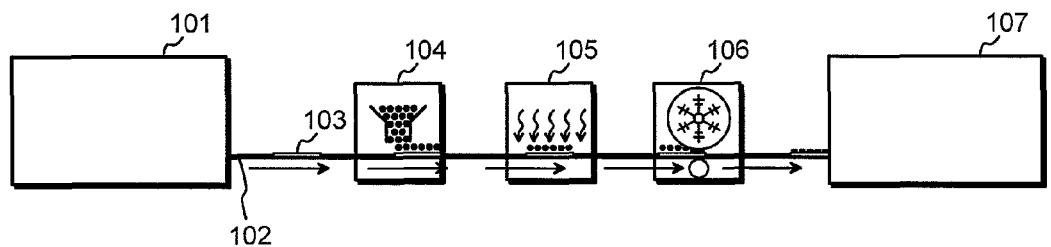

(51) Int. Cl.
 B05C 1/00 (2006.01)
 B05D 3/12 (2006.01)
 B05C 19/00 (2006.01)
 B05D 1/00 (2006.01)
 B05D 1/28 (2006.01)
 B05D 3/02 (2006.01)
 B05D 3/06 (2006.01)
 C23C 26/02 (2006.01)
 H05K 1/03 (2006.01)
 H05K 3/12 (2006.01)

(52) U.S. Cl.
 CPC .......... *B05D 3/029* (2013.01); *B05D 3/0263* (2013.01); *B05D 3/06* (2013.01); *B05D 3/12* (2013.01); *C23C 26/02* (2013.01); *H05K 3/102* (2013.01); *H05K 3/1283* (2013.01); *H05K 1/038* (2013.01); *H05K 1/0386* (2013.01); *H05K 3/1241* (2013.01); *H05K 3/1266* (2013.01); *H05K 2201/0293* (2013.01); *H05K 2203/0126* (2013.01); *H05K 2203/0517* (2013.01); *H05K 2203/0522* (2013.01); *H05K 2203/102* (2013.01); *H05K 2203/1105* (2013.01); *H05K 2203/1476* (2013.01); *H05K 2203/1545* (2013.01); *H05K 2203/1581* (2013.01)

(56) References Cited

U.S. PATENT DOCUMENTS

| | | | |
|---|---|---|---|
| 6,277,785 B1 | 8/2001 | Narita et al. | |
| 2004/0043139 A1 | 3/2004 | Daniels | |
| 2006/0057827 A1* | 3/2006 | Huhtasalo | H05K 3/207 438/584 |
| 2009/0047480 A1 | 2/2009 | Juers et al. | |
| 2009/0277007 A1* | 11/2009 | Maijala | H05K 3/1266 29/851 |
| 2010/0104741 A1* | 4/2010 | Vontell | B05D 1/305 118/106 |
| 2010/0155128 A1 | 6/2010 | Tombs et al. | |
| 2010/0231672 A1 | 9/2010 | Joyce et al. | |
| 2011/0147071 A1 | 6/2011 | Maijala et al. | |

FOREIGN PATENT DOCUMENTS

| | | |
|---|---|---|
| JP | 60-198225 A | 10/1985 |
| JP | 2009-543365 A | 12/2009 |
| JP | 2011-520279 A | 7/2011 |
| WO | WO 2004/080139 A1 | 9/2004 |
| WO | WO 2009/135985 A1 | 11/2009 |

OTHER PUBLICATIONS

Search Report dated Nov. 22, 2012, in Finnish Patent Application No. 20125087.
Written Opinion dated May 28, 2013, in PCT International Application No. PCT/FI2013/050099.
First Office Action dated Aug. 17, 2016, in Chinese Patent Application No. 201380007297.8, with English translation.
Notification of Reasons for Refusal dated Aug. 30, 2016, in Japanese Patent Application No. 2014-555274, with English translation.
Russian Office Action, dated Feb. 16, 2017, for Russian Application No. 2014133101, along with an English translation.

* cited by examiner

ARRANGEMENT FOR PRODUCING AN ELECTRICALLY CONDUCTIVE PATTERN ON A SURFACE

This application is a divisional of U.S. patent application Ser. No. 14/375,680 filed on Jul. 30, 2014 (now U.S. Pat. No. 9,352,351), which is the national phase of PCT International Application No. PCT/FI2013/050099 filed on Jan. 30, 2013, which claims the benefit of Finnish Patent Application No. 20125087 filed on Jan. 30, 2012. The entire contents of all of the above applications are hereby incorporated by reference.

TECHNICAL FIELD

The invention relates generally to the technology of producing conductive patterns on a substrate. Especially the invention concerns a case in which said conductive patterns are produced by printing.

BACKGROUND OF THE INVENTION

Printed electronics appear to hold a promise for enabling cost-effective integration of electronic functionality to a large variety of consumer products. Here it should be noted that even if a traditional, epoxy- or polyester based circuit board is often referred to as a printed circuit board (PCB), it does not fulfil the actual definition of printed electronics. In a PCB the use of (silk screen) printing is limited to producing the etch-resistant ink patterns prior to the etching of unwanted copper, as well as to producing visible markings on the surface of an otherwise completed board. True printed electronics mean that conductive, semiconductive, and/or possibly other patterns that constitute actual functional elements of the electronic circuit are formed on a substrate in a printing process. Although not mandatory, it is very advantageous if the process used to produce printed electronics is of the so-called roll-to-roll type, meaning that the substrate may come in the form of a long, rolled web, which is unwound for the printing step and can be again wound to a roll thereafter. Another widely used feeding mechanism is sheet feeding, in which the substrate comes in the form of a large number of sheets that are fed through the printing process.

A key question of producing printed electronics is how to ensure that conductive material is only distributed and attached to the desired portions of the substrate. A PCT application published with the publication number WO 2009/135985 contains a brief review of known methods, including electroplating, screen printing, flexo and rotogravure printing. Other known methods include inkjet printing and offset printing with conductive inks. Many of the known methods suffer from the drawback of requiring costly raw materials, like very fine-grained metal powder where the grain size is small enough not to clog spraying nozzles or the like.

Said PCT application discloses an improved method in which a substrate is first provided with patterns that attract conductive particles, by using either a spatially distributed electric charge or an adhesive or both. Conductive particles (which may in this case be much larger in size than in e.g. inkjet applications) are distributed onto the patterned substrate, so that they become attached only to the desired patterns. A sintering station with heated rolls is then used to sinter the particle-covered patterns into final conductive traces and areas that remain attached to the substrate. The PCT application published as WO 2009/135985 is incorporated herein by reference.

Although said improved method represents a clear advance compared to many previous methods, it leaves room for improvement in areas like peeling strength, continuity of conductivity, applicability of different conductive compounds and roll materials, as well as production speed.

SUMMARY OF THE INVENTION

An advantageous feature of embodiments of the present invention is the provision of a method and an arrangement for producing conductive patterns on a substrate with good adhesion, high peeling strength, and good continuity of conductivity.

The objectives of the invention are achieved by heating conductive particles attached to a substrate over their melting point, and thereafter pressing them against the substrate in a cold nip, the effective temperature of which is below said melting point.

According to an aspect of the invention, conductive particles that have become preliminarily attached to the substrate are heated, preferably with a non-contacting heating method, to a temperature that is higher than a characteristic melting point of the conductive particles. The melting point being "characteristic" means for example that if the conductive particles are composite particles where two or more constituents remain separate in different particles and/or even within a single particle, we speak of a melting point at which such a constituent melts that has a predominant effect on the creation of cohesion within the melt coming from a plurality of molten particles. Another way to define a "characteristic" melting point is to say that it is a temperature at and/or above which the substance in question begins to behave predominantly as a more or less viscous fluid. If the conductive particles are homogeneous in composition and consist only of one metal or alloy that has a well-defined melting point, in a straightforward manner the characteristic melting point is the melting point of that metal or alloy.

Very soon after said heating, within a time frame that does not allow the molten conductive material to solidify to a significant extent, the substrate with the molten conductive pattern is taken to a so-called cold nip, where pressure is applied against the patterned surface substrate. The nip being "cold" means that a temperature of at least one body that comes into contact with the patterned substrate in the nip is below said characteristic melting point. It does not need to be very much below; quite to the contrary in many cases it has been found advantageous if the temperature in the cold nip is only little less than the melting point. Thus, compared to room temperature the rolls or other entities that implement the "cold" nip might actually be considered relatively hot. It must also be taken into account that pressure has an effect on phase transformations, in addition to having an effect on the spreading and covalescing of the molten conductive material. Together the pressure and temperature in the cold nip are such that the conductive material leaves the nip in substantially solidified form that forms essentially conductive patches of the desired size, shape, and location on the surface of the substrate.

A particular class of embodiments of the invention involves a method for producing an electrically conductive pattern on a surface, comprising in the following order:
transferring electrically conductive solid particles onto an area of predetermined form on a surface of a substrate, which comprises one of: paper, board, polymer film, textile, non-woven material, heating the electrically conductive solid particles to a temperature that is higher than a characteristic melting point of the electrically conductive solid particles, thus creating a melt, and pressing the melt against the substrate in a nip, wherein a surface temperature of a portion of the nip that comes against the melt is lower than said characteristic melting point.

Another particular class of embodiments of the invention involves an arrangement for producing an electrically conductive pattern on a surface, comprising:

a particle handler configured to transfer electrically conductive solid particles onto an area of predetermined form on a surface of a substrate, which comprises one of: paper, board, polymer film, textile, non-woven material, a heater configured to heat electrically conductive solid particles on the surface of the substrate, to a temperature that is higher than a characteristic melting point of the electrically conductive solid particles, and thus configured to create a melt, a nip configured to press the melt against the substrate, and a nip temperature regulator configured to keep a surface temperature of a portion of the nip that comes against the melt lower than said characteristic melting point.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

Figure 2:
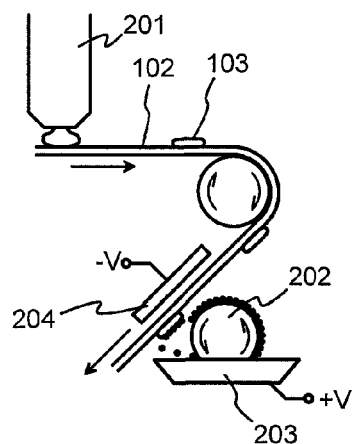
Figure 3:
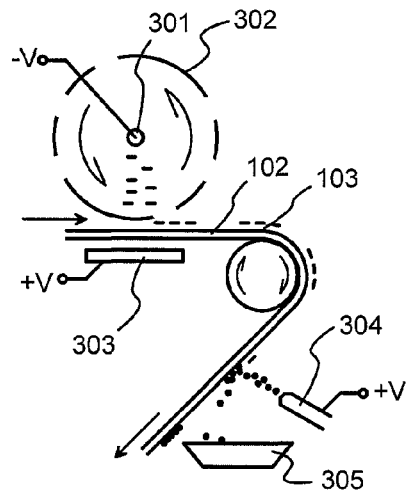
Figure 4:
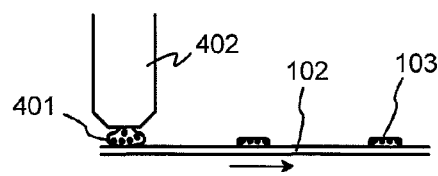
Figure 5:
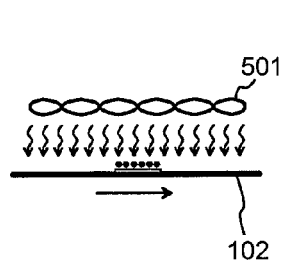
Figure 6:
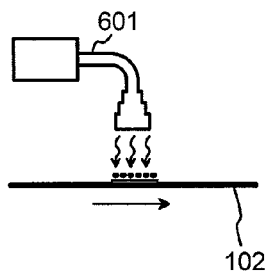
Figure 7:
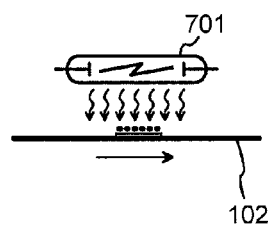
Figure 8:
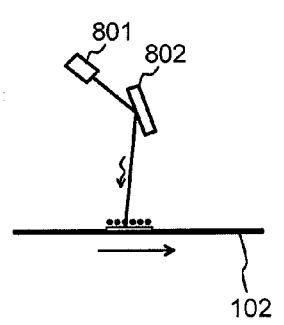
Figure 9:
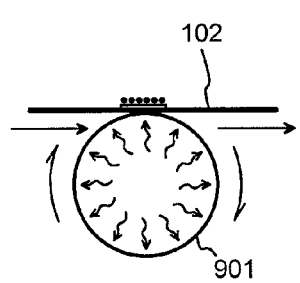
Figure 10:
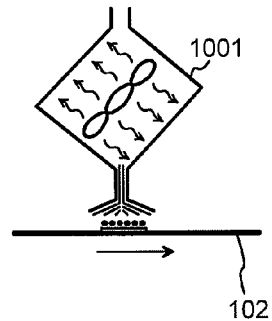
Figure 11:
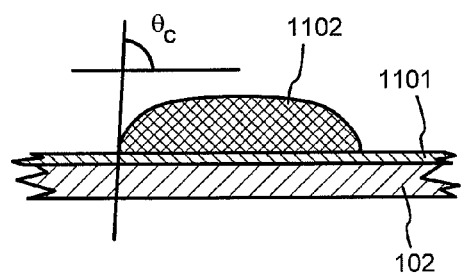
Figure 12:
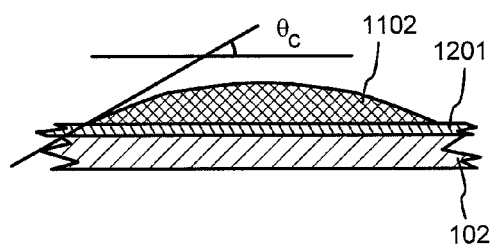

FIG. 1 illustrates a method and an arrangement according to an embodiment of the invention, FIG. 2 illustrates transferring electrically conductive solid particles on a substrate according to an embodiment of the invention, FIG. 3 illustrates transferring electrically conductive solid particles on a substrate according to another embodiment of the invention, FIG. 4 illustrates transferring electrically conductive solid particles on a substrate according to yet another embodiment of the invention, FIG. 5 illustrates infrared heating, FIG. 6 illustrates millimeter or micrometer wave heating, FIG. 7 illustrates flash lamp heating, FIG. 8 illustrates laser heating, FIG. 9 illustrates using a heated roll for heating, FIG. 10 illustrates using a heated gas flow for heating, FIG. 11 illustrates a melt with a relatively large contact angle, and FIG. 12 illustrates a melt with a relatively small contact angle.

DETAILED DESCRIPTION OF EMBODIMENTS OF THE INVENTION

FIG. 1 is a principle-level schematic illustration of both a method and an apparatus according to an embodiment of the invention. A substrate handler mechanism comprises a substrate feeder 101, which can be for example an unwinding station where a fibrous web is unwound from a roll, or a stack handler where sheets or corresponding planar substrate pieces are taken from a stack. The substrate is generally designated with the reference designator 102, and it can be of any of a wide variety of materials, shapes and thicknesses. Paper, board and polymer films (plastics) have been considered good substrates, but other similar non-conductive surfaces may be also used.

The reason for the non-conductivity assumption is the fact that making patterns that are specifically conductive, especially for the purposes of printed electronics, has little importance if the substrate is also conductive so that it would short circuit the patterns to each other. As such, paper or board can be coated, uncoated, wood-free or wood-containing. Multilayered substrates are also usable, in which case the substrate does not need to be thoroughly non-conductive; it is sufficient if the surface onto which the conductive patterns will be printed is non-conductive. Other possible substrates include for example textiles, non-woven materials, circuit boards of electronics industry, moulded articles, and glass. Further possibilities involve construction materials, such as wallpapers and floor coatings, unfired and fired ceramics, (bio)polymer bases and composites. Each one of the listed substrates has its own application areas and advantages.

In the example of FIG. 1 we assume that the substrate feeder 101 comprises also means for creating an adhesion area 103 on the surface of the substrate 102. For the purposes of the present invention it is not essential to create an adhesion area, but it may help in simplifying the next step in the process. An adhesion area is characterised in that adhesion of electrically conductive solid particles (which will be transferred onto the surface of the substrate in the next step) to the substrate is stronger within the adhesion area than outside it. For the purposes of the present invention it is not important, what is the actual mechanism of increasing adhesion; it may be for example dispersive adhesion (i.e. gluing) or electrostatic adhesion. As an example of the former, the substrate feeder 101 may comprise an adhesive printing or lacquering section (not separately shown) that is configured to spread an adhesive or lacquer onto the substrate to create an adhesion area of predetermined form. If electrostatic adhesion is relied upon, the substrate feeder 101 may comprise an electric charger section that is configured to create a spatial distribution of static electric charge in the substrate (or on the substrate surface) to create an adhesion area of predetermined form. In some cases it may be desirable to make the adhesion area 103 cover the whole surface of the substrate, either because the whole surface is to be covered with a conductive pattern or because the form and size of the conductive pattern will be determined by selectively transferring electrically conductive solid particles to only a part of the adhesion area. Therefore we may conclude that a limiting case of the concept "predetermined form" is the form of the whole substrate.

The process step that is illustrated as taking place in section 104 in FIG. 1 involves transferring electrically conductive solid particles onto an area of predetermined form on a surface of the substrate 102. Consequently the part of the apparatus responsive for the operation in section 104 may be called a particle handler, and it is configured to implement said transfer of electrically conductive solid particles onto said area of predetermined form on the surface of the substrate 102. Possible exemplary implementations of the particle handler will be described in detail later in this text. In the exemplary embodiment of FIG. 1 we assume that electrically conductive solid particles are selectively applied only to the adhesion areas that were created within the substrate feeder 101. It is also possible to transfer electrically conductive solid particles onto the surface of the substrate with a method that involves simultaneously creating the necessary adhesion. For example, the electrically conductive solid particles may come as a part of a compound that contains, in addition to the electrically conductive solid particles, a fluid or gelatinous substance that has adhesive properties. That could make the preparatory creation of adhesion areas 103 completely unnecessary at any step that precedes section 104; on the other hand leaving out the preparatory creation of adhesion areas may impose stricter requirements to the operating accuracy of the particle handler, because it must alone ensure that only the desired, predetermined areas of the surface of the substrate will be covered with the electrically conductive solid particles.

The method step and apparatus section schematically illustrated as 105 comprises heating the electrically conductive solid particles to a temperature that is higher than a characteristic melting point of the electrically conductive solid particles. Using a heater configured to apply a non-contacting heating method involves the advantageous characteristic that the heating will not easily cause smearing or unwanted macroscopic changes in the spatial distribution of conductive material on the surface of the substrate. In other words, the electrically conductive matter stays in place where it was meant to be. However, the invention does not specifically exclude heating methods that are contacting. Especially if a contacting heating method involves the use of a very low contact pressure, it may well have the same advantageous non-smearing characteristics. As a result of the heating, a melt is created.

The method step and apparatus section schematically illustrated as 106 is the so-called cold nip, where the designator "cold" must be understood to mean "relatively cold" compared to the heating section that precedes it. In the cold nip, the melt that was created by heating in section 105 is pressed against the substrate 102. Because the invention allows (but does not require) using an adhesive agent on the surface of the substrate to create the adhesion area 103, pressing the melt against the substrate conceptually covers both pressing a melt directly against a substrate and pressing a melt against an adhesive layer that is located on the surface of the substrate between the melt and the substrate. A surface temperature of a portion of the cold nip that comes against the melt is lower than the characteristic melting point that was discussed above. Thus the cold nip will cause the previously molten material of the originally solid electrically conductive particles to solidify again, but this time not in the form of separate particles but in the form of an essentially continuous, electrically conductive layer that covers that area on the surface of the substrate onto which the electrically conductive solid particles were transferred in the particle handler 104.

It has been found advantageous to maintain the effective temperature (i.e. the surface temperature of that portion of the cold nip that comes against the melt) in the cold nip only little lower than said characteristic melting point. This ensures for example that the melt will not solidify prematurely, before it would become pressed against the substrate. It also ensures that the solidification will take place sufficiently slowly, so that under the nip pressure the melt will still have some time to flow and form the essentially continuous layer of electric conductivity that is aimed at, as well as to flow into eventual pores or voids in the substrate surface, which enhances adhesion. On the other hand, using a cold nip (and not a hot one that would aim to maintain the molten state of the melt) involves the advantage that despite the nip pressure, the edges of the desired conductive pattern will largely maintain their location and size. In other words, the molten conductive material will not gush across the surface of the substrate to fill, stain, or drip to areas of the surface that were meant to remain non-conductive.

According to an embodiment of the invention, the difference between the cold nip temperature and the characteristic melting point is not more than about 50-60 degrees centigrade, i.e. the surface temperature of the portion of the nip that comes against the melt is not lower than 60 degrees centigrade below the characteristic melting point. In many cases an even much smaller difference in temperature can be used. It has been found that the optimal difference between the cold nip temperature and the characteristic melting point is—at least to some extent—a function of the speed at which the substrate is driven through the process. In one test arrangement the substrate was driven at 6 meters per minute, and the temperatures were between 175 and 177 degrees centigrade, ends included, for the characteristic melting point and 142 degrees centigrade for the cold nip. When everything else was kept the same but the driving speed was increased to 10 meters per minute, it was found that the optimal cold nip temperature was 151 degrees centigrade. In said test arrangement the general conclusion was that at driving speeds varying between 5 and 10 meters per minute, the cold nip temperature should be selected in the range from 135 to 155 degrees centigrade, ends included, with faster driving speeds corresponding to higher cold nip temperatures.

It should be noted that when the metal alloy that was used in said test arrangement is heated, it begins to soften at 135 degrees centigrade already but melts fully only at 177 degrees centigrade (hence the somewhat flexible value for the characteristic melting point used in the example above). It is typical to non-eutectic metal alloys that they have the so-called solidus and liquidus temperatures, between which they exist as a paste of solid particles in a melt of the lower-melting phase. For some non-eutectic alloys it may be better to consider the liquidus temperature as the characteristic melting point, because above the liquidus temperature it is certain that the substance in question behaves predominantly as a fluid. For some other non-eutectic alloys, however, the behaviour of the substance between its solidus and liquidus temperatures is so fluid-like (e.g. when the alloy of two metals only contains a relatively small amount of the hotter-melting metal) that it may be justified to consider the solidus temperature (or some other temperature between the solidus and liquidus temperatures) as the characteristic melting point.

Non-eutectic alloys have in general been found to suit the purposes of the present invention very well, even better than eutectic ones or pure metals that have a well-defined single temperature as their melting point. This is particularly true for non-eutectic alloys of the kind mentioned above, that begin to behave fluid-like already below their liquidus temperature. The partially molten alloy may behave like a porridge or a relatively viscous fluid, which makes its movements on the surface of the substrate foreseeable and easy to control. Additionally the temperature range between the solidus and liquidus temperatures allows for some tolerances in controlling the temperatures of the various parts of the apparatus. To the contrary, an eutectic alloy or a pure metal may exhibit a very sharp transition between a completely solid state and a liquid state of very low viscosity, which makes it prone to difficulties in keeping the correct temperatures and controlling the flow of the conductive material at and after heating.

Saying that the produced conductive patterns are essentially continuous means that they need to be continuous only to the extent that throughout each pattern they offer the desired cross section of conductive substance, so that electric resistance does not becomes prohibitively high. Another factor that defines the required continuity (and accuracy in location) is the size of contact pads in components that will be attached to the printed conductive patterns, as well as the accuracy at which such attaching will be performed. It is easy to understand that if the typical size of contact pads is in the order of magnitude of a square millimetre, individual pores in the corresponding printed conductive pattern may be quite acceptable if they are smaller than that, for example in the order of a few hundred micrometers or smaller.

In some embodiments of the invention it may even be advantageous to keep the so-called cold nip temperature equal or almost equal to the characteristic melting point of the used electrically conductive material. Even if that may mean that the actual solidifying of the material takes place only immediately after the cold nip and not in the cold nip itself, the pressure applied with the rollers of the cold nip may still have very advantageous effects in terms of e.g. adhesion and surface smoothness.

The substrate handler mechanism that is schematically illustrated in FIG. 1 comprises a substrate collector 107, in which the substrate with the completed conductive patterns on its surface is collected. The substrate collector 107 may comprise for example a winder station or a stacker, in which a continuous-web like substrate is wound into a roll or the pieces of a sheet-like substrate are stacked respectively. The substrate collector 107 may comprise also postprocessing means that are configured to postprocess the substrate after forming the conductive patterns, for example by cooling, removing static electric charge, coating, evaporation of volatile components of substances present within or on the substrate, or the like.

Next we will consider some examples for implementing some of the sections described above in practice. FIG. 2 illustrates an embodiment of the invention where the adhesion areas 103 are created by spreading adhesive onto the substrate 102 with an adhesive applicator 201. A very wide variety of methods have been known for a very long time to apply an adhesive onto the surface of a planar, sheet-like or web-like substrate, and for the purposes of the present invention it is not important, what method is used. In the schematic illustration of FIG. 1 the application of an adhesive would be included in the substrate feeder 101.

The applied patches of adhesive thus constitute the adhesion areas. In order to transfer the electrically conductive solid particles onto these areas the substrate is taken past a transfer roll 202, which in this embodiment of the invention is configured to have a slightly sticky surface and to rotate through a fluidized powderbed 203 of electrically conductive solid particles. These become temporarily attached to the surface of the transfer roll 202, and simultaneously acquire an electric charge of a specific polarity. A counterelectrode 204 of the opposite polarity is located behind the substrate that passes by, so that when the electrically charged conductive particles experience the created electric field, they tend to migrate towards the counterelectrode 204. Those of the electrically conductive particles that hit the adhesive stay there, while others return to the fluidized powderbed 203.

The use of an electric field is only an additional feature in this embodiment of the invention. If the dimensioning is right, it is possible to make the electrically conductive solid particles hop over from the transfer roll 202 to the adhesion areas by only relying on the adhesion properties of the sticky surface of the transfer roll on one hand and of the adhesion areas on the other hand. Particles that are temporarily attached to the slightly sticky surface of the transfer roll stick more strongly to an adhesion area if they come into touch with one, and are consequently ripped off the surface of the transfer roll, while particles that only meet the bare surface of the substrate 102 remain attached to the transfer roll. The surface of the transfer roll being "sticky" does not limit the way in which the adhesion between it and the electrically conductive solid particles is created; in particular the adhesion between the transfer roll surface and the electrically conductive solid particles is not limited to dispersive adhesion of the kind that adhesive chemical compounds create in sticky tapes. If the electrically conductive solid particles have magnetic properties, the adhesion can be created with magnetism. If the materials and their properties allow, also electrostatic adhesion can be considered.

FIG. 3 illustrates an embodiment of the invention where both the creation of adhesion areas and the transfer of electrically conductive solid particles have implemented in a different way. In order to create the adhesion areas, a spatial distribution of static electric charge is created in the substrate, taking advantage of the fact that the substrate is as such not conductive and thus does not easily allow the spontaneous equalisation of electric charge. In this embodiment the spatial distribution of static electric charge is created by allowing a corona wire 301 emit negative charges inside a rotating grid roll 302. In the direction of the substrate 102 is a counterelectrode 303, which has a more positive potential than the corona wire 301, giving rise to an electric field that accelerates the electrons towards the substrate 102. Those electrons that pass through the openings in the grid roll 302 hit the surface of the substrate, so that local patches of excess negative charges are created. These constitute the adhesion areas 103.

A particle jet 304 is used to blow electrically conductive solid particles towards the substrate, either continuously or synchronized with the known occurrence of electrically charged adhesion areas at the spot where the particle jet 304 is pointing. A positive voltage coupled to the particle jet 304 ensures that the electrically conductive solid particles acquire a positive charge, so that they are driven towards the electrically charged adhesion areas by Coulomb interaction. A collection system 305 collects those electrically conductive solid particles that bounce off the substrate or for other reasons do not become attached to the adhesion areas.

One embodiment of the invention which externally resembles the embodiment of FIG. 2 and which can thus be also represented by FIG. 2, is one where a spatial distribution of electric charge is created on an outer surface of a dielectric transfer roll. The electrically conductive solid particles are brought into contact with the surface of the dielectric transfer roll, where the electrically conductive particles remain temporarily held in place by coulomb interaction, but this time only at locations that correspond to the desired conductive patterns to be formed on the substrate. The dielectric transfer roll is pressed against the substrate in order to transfer the electrically conductive solid particles onto the surface of the substrate.

It is not necessary to use electric fields for transferring electrically conductive solid particles onto the adhesion areas or to make them become attached. The movement of the electrically conductive solid particles may be generated by purely mechanical means, especially in those embodiments of the invention where an adhesive is spread onto the substrate in order to create the adhesion areas. For example, the particle jet 304 and collection system 305 of FIG. 3 could be used in such embodiments without any applied voltages.

FIG. 4 is a schematic illustration of an embodiment of the invention where the electrically conductive solid particles are transferred onto the appropriate area of the surface of the substrate as a part of a compound 401 that contains, in addition to the electrically conductive solid particles, a fluid or gelatinous substance. For this purpose the particle handler comprises an applicator, which is schematically illustrated in FIG. 4 with reference number 402. We may denote the compound 401 as paste. For the purposes of the present invention it is not important, what is the exact implementation of the applicator 402; for example from the technology of applying solder paste to circuit boards there are known a number of different techniques for applying a paste-like compound onto desired areas of a planar substrate.

It should be noted that the present invention allows the electrically conductive solid particles to be relatively large in size, and this applies both to embodiments where the particles come as a part of a paste-like compound and to embodiments where the particles are transferred onto the substrate as dry powder. This is important, because electrically conductive solid particles tend to become more expensive the smaller size is required. For example at the time of writing this description silver pastes are known and recommended for inkjet type application, with a maximum silver particle size of one micrometre and with prices of several thousands of dollars per litre. In comparison, particles of tin-containing alloys in the size class of tens of micrometers come at a price of only some tens of dollars per kilogram. The latter are perfectly suitable for the purposes of the present invention.

It should also be noted that if for example a silk screen type application method is used as the applicator 402, and the density of electrically conductive particles in the printing paste is high enough, it would basically be possible to utilize—possibly after a drying period that evaporates away volatile compounds of the printing paste—the silk screen printed areas directly as conductive patterns on the substrate. However, experience suggests that it would be difficult to reach the desired high values of continuity in conductivity, as well as bending resistance and peeling strength, if the heating and cold nip according to embodiments of the invention were not used. Other printing methods that can be used as the schematically illustrated applicator 402 include, but are not limited to, offset printing, gravure printing, flexo printing, letterpress printing, and inkjet printing.

Whether or not some specific adhesion areas have been created on the surface of the substrate before applying the paste containing the electrically conductive solid particles is not important to the present invention. Using an adhesive or a primer to create adhesion areas may involve advantages in the form of placing less stringent requirements to the adhesive properties of the fluid or gelatinous substance in the paste. If adhesion areas are created, any of the previously mentioned methods can be used for their creation. Additionally the adhesion areas may have a role in preconditioning the surface of the substrate so that the desired flowing and wetting properties are achieved for the paste, and/or so that after the heating, desired flowing and wetting properties are achieved for the melt.

Some examples of non-contacting heating methods, and heaters configured to apply them, are illustrated in FIGS. 5 to 10. In each case the substrate 102 and its assumed movement past the heater is schematically illustrated. FIG. 5 illustrates heating through exposure to infrared radiation coming from a radiator 501, and FIG. 6 illustrates heating through exposure to micro- or millimetre radiation coming from a micro- or millimetre radiation source 601. In these embodiments, as in all embodiments where the increase of temperature of the electrically conductive solid particles is based on the absorption of electromagnetic radiation, one may utilize the different absorption characteristics of the electrically conductive solid particles and the substrate. The same is true for inductive heating, which can be used for heating the electrically conductive solid particles, because the substrate is dielectric and will not experience any inductively created electric currents and will thus remain relatively cool.

FIG. 7 illustrates heating through exposure to wide-spectrum optical radiation, which in this case comes from a electric discharge lamp 701 that can be similar to those used in the so-called flash lamp annealing of thin film coatings. FIG. 8 illustrates an embodiment of the invention where the heating takes place through exposure to laser radiation, which comes from a laser source 801 and is controllably directed to the desired locations on the substrate surface by using controllable optics 802. The combined use of controllable mirrors and shutters enables directing the laser beam accurately at only those locations on the substrate surface where there are electrically conductive solid particles to be heated. This may be advantageous especially if the substrate is of the kind the unnecessary heating of which should be avoided.

It should be noted that describing the heating method as a non-contacting one means strictly taken that only the electrically conductive solid particles should not be touched; touching e.g. other parts of the substrate is not excluded in those embodiments of the invention. Therefore this definition covers also the embodiment of FIG. 9, where the heating is accomplished by bringing the other surface of the substrate 102 into contact with a heated body, which in this case is a heated roll 901. FIG. 10 illustrates yet another alternative non-contacting heating method, in which a stream of hot gas emerges from a heater 1001 towards the surface of the substrate 102.

A contacting heating method that uses very low contacting pressure could be for example one in which the surface with the electrically conductive particles distributed on it is driven past a heated roll, however without applying any significant pressure. The tightness or rigidity of the substrate, as well as accurate spatial tuning of the rotation axis of the roll, may be relied upon in ensuring that the contact between the roll and the electrically conductive particles remains extremely light.

An important application of printed electronics is the provision of conductive surfaces on heat-sensitive substrates like paper and cardboard, which may also comprise polymer and other layers. Methods like those disclosed in patent application number PCT/FI2008/050256, published as WO2009/135985, allow making the conductive surfaces of metallic compounds that are—or resemble—so-called low temperature solders. A non-limiting example list of such metallic compounds includes (indicated percentages are weight percentages):

tin/silver (3.43%)/copper (0.83%)
tin/silver (2-2.5%)/copper (0.8%)/antimony (0.5-0.6%)
tin/silver (3.5%)/bismuth (3.0%)
tin/zink (10%)
tin/bismuth (35-58%)
tin/indium (52%)
bismuth (53-76%)/tin (22-35%)/indium (2-12%)
tin (35-95%)/bismuth (5-65%)/indium (0-12%).

At room pressure, the first four listed examples melt between 180 and 220 degrees centigrade, while the four last-mentioned may melt at significantly lower temperatures, even below 100 degrees centigrade. Simultaneously the melting and the following spreading and coalescing of a metallic compound may depend on pressure in such a way that increasing pressure may assist them. The melting temperature, or characteristic melting point, has significance to the dimensioning of the heater, because it naturally needs not be capable of generating much higher temperatures than what is needed to create the melt.

According to one embodiment of the invention the electrically conductive particles are made of an alloy of tin and bismuth, which has a melting point at 139° C., and the surface temperature of the portion of the nip that comes against the melt is essentially 110° C. According to another embodiment of the invention the electrically conductive particles are made of an alloy of tin, bismuth, and indium, which has a melting point at 79° C., and the surface temperature of the portion of the nip that comes against the melt is only a few degrees lower.

Experiments with embodiments of the invention have shown that the contact angle between the melt, which is created by heating the electrically conductive solid particles, and the surface on which the melt rests has certain significance. FIG. 11 illustrates a substrate 102, on which an adhesion area has been created by spreading an adhesive layer 1101 on its surface. One or more electrically conductive particles have been transferred onto the adhesion area and heated with a (preferably non-contacting) heating method to a temperature that is higher than a characteristic melting point of the electrically conductive solid particles. Thus, a melt 1102 has been created. In the case of FIG. 11 we assume that the cohesive force between the atomic constituents of the melt are relatively large compared with the adhesive force between the atomic constituents of the melt and those of the surface below it (the adhesive layer 1101). As a result, the contact angle $\theta_c$ remains relatively large; we may say that wetting of the adhesive surface by the melt remains moderate.

In comparison, FIG. 12 illustrates an otherwise similar situation but this time the forces of cohesion and adhesion mentioned above are better in balance due to the selection of a slightly different material for the adhesive layer 1201. In some cases a similar balance of said forces could have been obtained by selecting a different material for the electrically conductive solid particles; or by selecting a different temperature to which the electrically conductive solid particles were heated; or by using a different thickness of the adhesive layer; or by leaving out the adhesive layer altogether; or by bringing a certain amount of suitable auxiliary material onto the surface together with the electrically conductive solid particles; or by performing the melting step in a suitable gaseous atmosphere (i.e. selecting both the pressure and the constituents of the gaseous atmosphere suitably); or through any combination of these measures. As a result, the contact angle $\theta_c$ becomes relatively small. We may say that better wetting of the adhesive surface by the melt occurs.

For the purposes of the present invention, the situation illustrated in FIG. 12 is more favourable. In other words, the materials, material thicknesses, process temperatures and other characteristics present at the heating step should be selected so as to produce a small contact angle between the melt and the surface on which the melt. For the purposes of the present invention we use the definition of contact angle as illustrated in FIGS. 11 and 12, which associates a small contact angle with good wetting. It should be noted that some sources may use a different definition of the concept "contact angle".

Volatile substances may have ended up in the substrate, possible adhesive layer, and/or the layer where the electrically conductive solid particles are, from various sources and for various reasons. For example, an adhesive substance used for an adhesion layer, or the liquid or gelatinous substance used to make a paste of the electrically conductive solid particles, may contain solvents in order to make handling and spreading easier. Solvents and other volatile substances of this kind should in many cases be eliminated from the final product, which necessitates allowing them to evaporate and/or react chemically at some stage of the manufacturing process. Heating promotes evaporization, so—especially if the appropriate ventilation is taken care of—the heating method used to create the melt may additionally implement evaporation of a volatile component, which may be for example a volatile component of the fluid or gelatinous substance mentioned above.

Changes and additions can be made to the examples described so far, which means that the examples do not limit the applicability of the appended claims.

The invention claimed is:
1. An arrangement for producing an electrically conductive pattern on a surface, comprising:
   a particle handler configured to transfer electrically conductive solid particles onto an area of predetermined form on a surface of a paper, board, polymer film, textile, or non-woven material substrate,
   a heater configured to heat electrically conductive solid particles on the surface of the substrate, to a temperature that is higher than a characteristic melting point of the electrically conductive solid particles, and thus configured to create a melt,
   a nip configured to press the melt against the substrate, and
   a nip temperature regulator configured to keep a surface temperature of a portion of the nip that comes against the melt at least 60 centigrade degrees below said characteristic melting point, wherein the melt of the conductive particles is solidified in the form of an essentially continuous, electrically conductive layer covering the area of the particles on the surface of said substrate.

2. An arrangement according to claim 1, comprising at least one of:
   an adhesive printing section configured to spread an adhesive onto said substrate to create said area of predetermined form, and
   an electric charger section configured to create a spatial distribution of static electric charge in said substrate to create said area of predetermined form.

3. An arrangement according to claim 1, wherein the particle handler is configured to transfer the electrically conductive solid particles onto the area of predetermined form on the surface of the substrate either as a dry powder or as a part of a compound that contains, in addition to the electrically conductive solid particles, a fluid or gelatinous substance.

4. An arrangement according to claim 2, wherein the particle handler is configured to transfer the electrically conductive solid particles onto the area of predetermined form on the surface of the substrate either as a dry powder or as a part of a compound that contains, in addition to the electrically conductive solid particles, a fluid or gelatinous substance.

5. An arrangement according to claim 1, wherein the heater comprises at least one of the following: an infrared radiator, a micro- or millimeter wave radiator, a flash lamp, a laser source, a heated body for passing the substrate on with that side of the substrate against the heated body that does not have electrically conductive solid particles on it.

* * * * *